US012796066B2

(12) United States Patent
You et al.

(10) Patent No.: US 12,796,066 B2
(45) Date of Patent: Nov. 10, 2026

(54) INTEGRATED CIRCUIT WITH STACKED TRANSISTORS HAVING INDUCTORS AT BOTH SIDES OF SUBSTRATE

(71) Applicant: TAIWAN SEMICONDUCTOR MANUFACTURING COMPANY, LTD., Hsinchu (TW)

(72) Inventors: Wei-Xiang You, Hsinchu (TW); Ming-Long Fan, Hsinchu (TW); Ying-Ta Lu, Hsinchu (TW); Szuya Liao, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 493 days.

(21) Appl. No.: 18/231,938

(22) Filed: Aug. 9, 2023

(65) Prior Publication Data

US 2024/0290779 A1 Aug. 29, 2024

Related U.S. Application Data

(60) Provisional application No. 63/487,167, filed on Feb. 27, 2023.

(51) Int. Cl.

| | |
|---|---|
| ***H10D 84/80*** | (2025.01) |
| ***H10D 1/20*** | (2025.01) |
| ***H10D 1/68*** | (2025.01) |
| ***H10W 20/40*** | (2026.01) |
| ***H10W 20/42*** | (2026.01) |
| ***H10W 20/43*** | (2026.01) |

(52) U.S. Cl.
CPC ............. *H10D 84/811* (2025.01); *H10D 1/20* (2025.01); *H10D 1/68* (2025.01); *H10W 20/42* (2026.01); *H10W 20/43* (2026.01); *H10W 20/496* (2026.01); *H10W 20/497* (2026.01)

(58) Field of Classification Search
CPC . H10W 20/496; H10W 20/497; H10W 20/42; H10W 20/43; H10D 84/85; H10D 88/00; H10D 84/811; H10D 1/20; H10D 1/68
See application file for complete search history.

(56) References Cited

U.S. PATENT DOCUMENTS 12,279,452 B2 * 4/2025 Cheng ................ H10D 30/6757
2009/0072942 A1 * 3/2009 Wei ..................... H01F 17/0006 336/200
2013/0100065 A1 * 4/2013 Felnhofer ................. G01J 1/26 345/174

(Continued)

*Primary Examiner* — Galina G Yushina
(74) *Attorney, Agent, or Firm* — Hauptman Ham, LLP

(57) ABSTRACT

An integrated circuit device includes a first-type transistor and a second-type transistor stacked with each other at a front side of a substrate. The second-type transistor is between the first-type transistor and the substrate. The integrated circuit device also includes a front-side inductor having one or more conductors in a front-side upper metal layer above both the first-type transistor and the second-type transistor, and a back-side inductor having one or more conductors in a back-side lower metal layer at a back side of the substrate. The front-side inductor, the first-type transistor, and the second-type transistor form a stack directly above the back-side inductor.

20 Claims, 13 Drawing Sheets

(56) References Cited

U.S. PATENT DOCUMENTS

| | | | | |
|---|---|---|---|---|
| 2013/0135057 | A1* | 5/2013 | Roithmeier | H03B 5/1265 331/117 FE |
| 2013/0169374 | A1* | 7/2013 | Huang | H03B 5/1243 331/117 FE |
| 2019/0393148 | A1* | 12/2019 | Uchida | H10D 1/20 |
| 2020/0005980 | A1* | 1/2020 | Dong | H01F 17/0013 |
| 2020/0235134 | A1* | 7/2020 | Lilak | H10D 64/017 |
| 2023/0113614 | A1* | 4/2023 | O'Brien | H10D 86/421 257/288 |
| 2023/0420512 | A1* | 12/2023 | Yemenicioglu | H10D 62/121 |

* cited by examiner

INTEGRATED CIRCUIT WITH STACKED TRANSISTORS HAVING INDUCTORS AT BOTH SIDES OF SUBSTRATE

PRIORITY CLAIM

The present application claims the benefit of U.S. Provisional Application No. 63/487,167, filed Feb. 27, 2023, which is incorporated herein by reference in its entirety.

BACKGROUND

An integrated circuit (IC) typically includes a number of IC devices that are manufactured in accordance with one or more IC layout diagrams. IC devices sometimes include complementary field effect transistor (CFET) devices. A CFET device generally has an upper FET overlying a lower FET in a stacked configuration. Both the upper FET and the lower FET in a CFET device are positioned above the conductive lines in a back-side conductive layer but below the conductive lines in a front-side conductive layer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
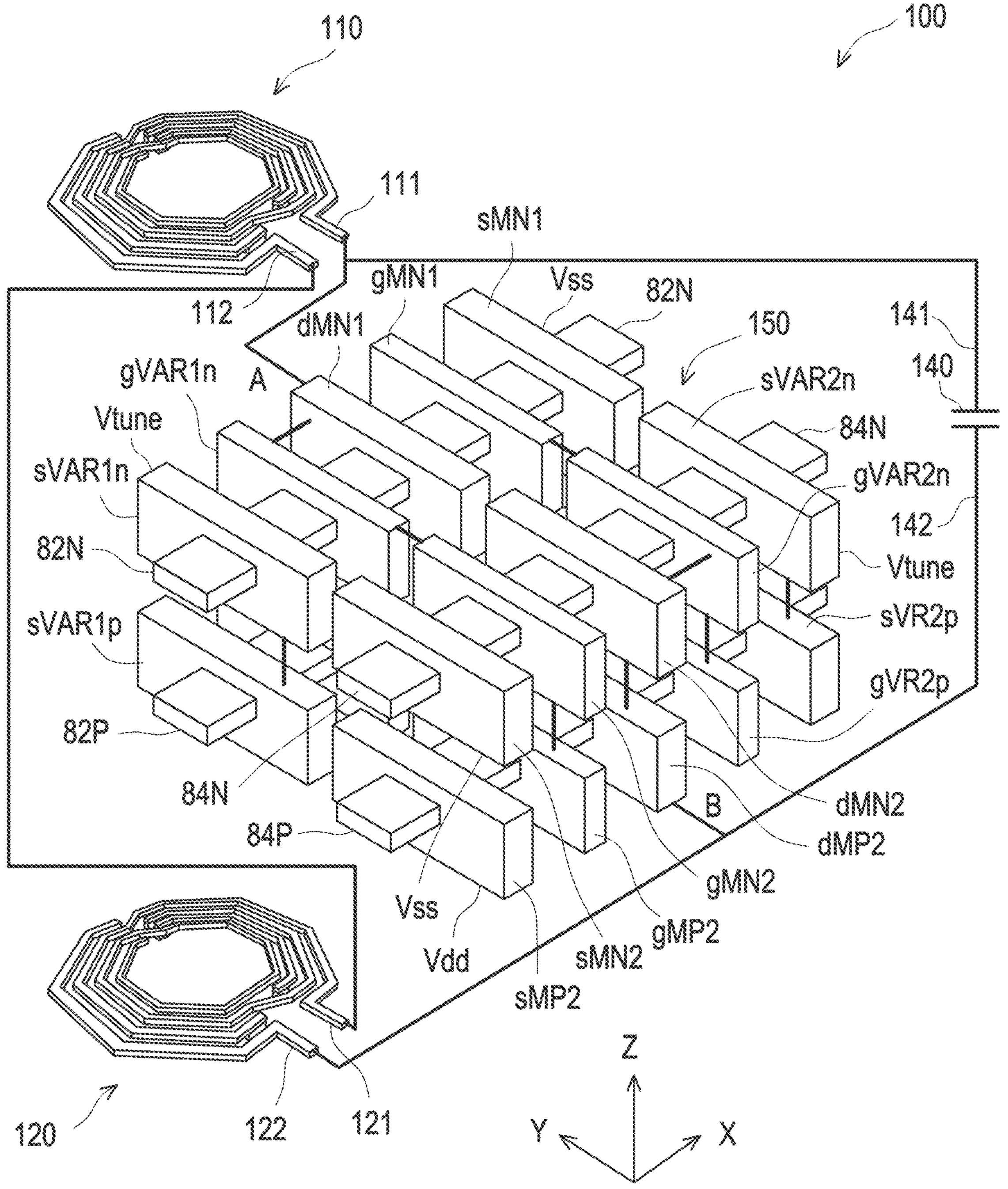
FIG. 1A is a schematic drawing of an LC oscillator circuit, in accordance with some embodiments.

The following disclosure provides many different embodiments, or examples, for implementing different features of the provided subject matter. Specific examples of components, materials, values, steps, operations, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, an integrated circuit device includes a complementary field effect transistor (CFET) device having a first-type transistor as an upper FET and having a second-type transistor as a lower FET. The first-type transistor and the second-type transistor are stacked with each other at the front side of a substrate. The integrated circuit device also includes a front-side inductor and a back-side inductor. The front-side inductor includes one or more conductors in a metal layer above both the first-type transistor and the second-type transistor. The back-side inductor includes one or more conductors in a metal layer at the back side of the substrate. In some embodiments, the integrated circuit device further includes a capacitive element, and an LC oscillator in the integrated circuit device is formed with the capacitive element, the front-side inductor, the back-side inductor, and the transistors in the integrated circuit device. In some embodiments, when the front-side inductor is stacked directly above the back-side inductor, the area occupied by the LC oscillator in the integrated circuit device is reduced.

Figure 1B:
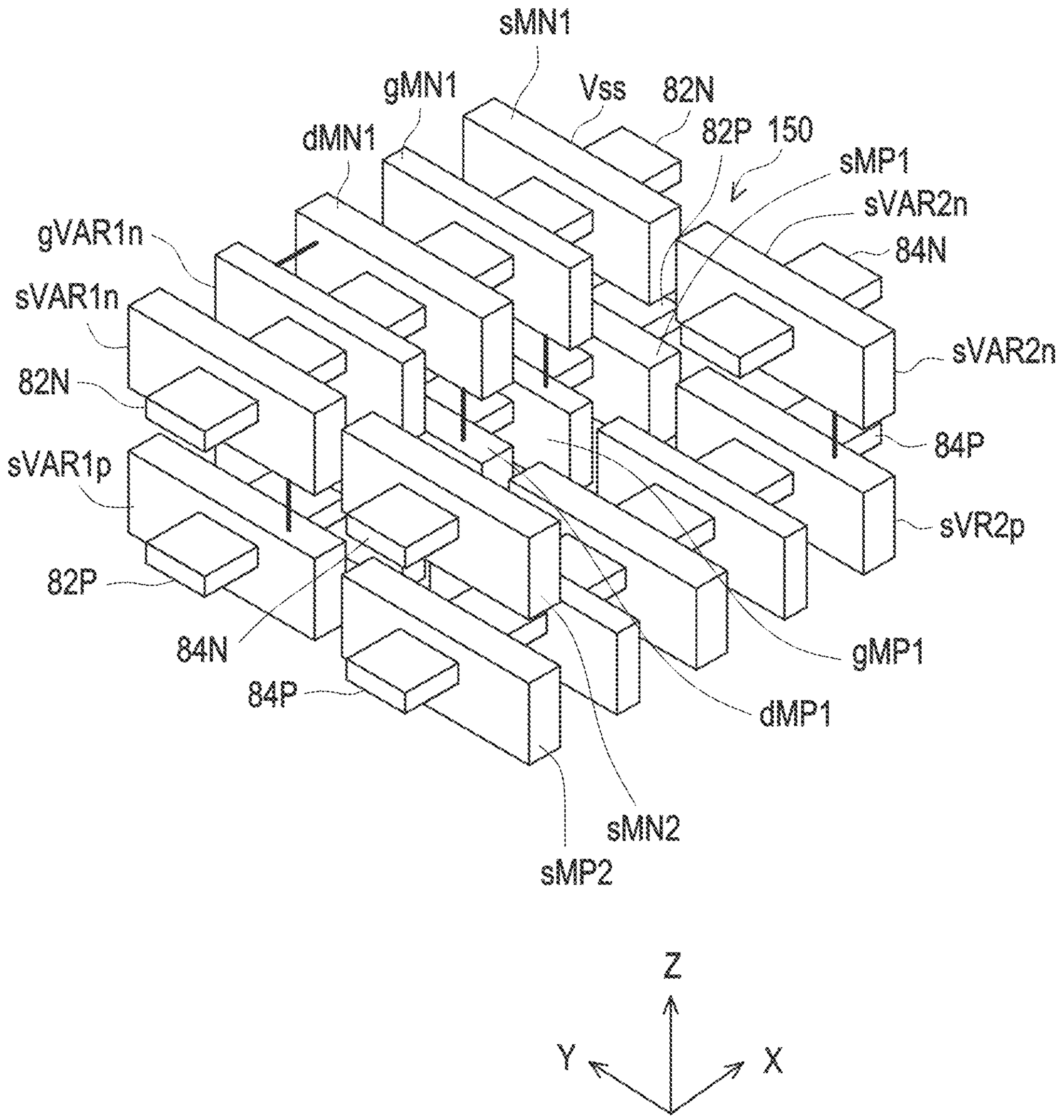
FIG. 1B is a schematic drawing of selected components in the FEOL element of FIG. 1A, in accordance with some embodiments.

FIG. 1A is a schematic drawing of an LC oscillator circuit 100 based on inductors in both the front-side and the back-side of a substrate and based on stacked transistors in the front-side of the substrate, in accordance with some embodiments. In FIG. 1A, The LC oscillator circuit 100 includes a front-side inductor 110, a back-side inductor 120, a capacitive element 140, and a FEOL element 150 having stacked transistors. The stacked transistors and other components in the FEOL element 150 are fabricated during Front End of Line (FEOL) process. The front-side inductor 110, the back-side inductor 120, and the capacitive element 140 are fabricated during Back End of Line (BEOL) process. FIG. 1B is a schematic drawing of selected components in the FEOL element 150 of FIG. 1A, in accordance with some embodiments. Some components of the FEOL element 150 which are not directly visible in FIG. 1A are exposed in FIG. 1B, after removing some parts of the FEOL element 150 from the schematic drawing.

Figure 2:
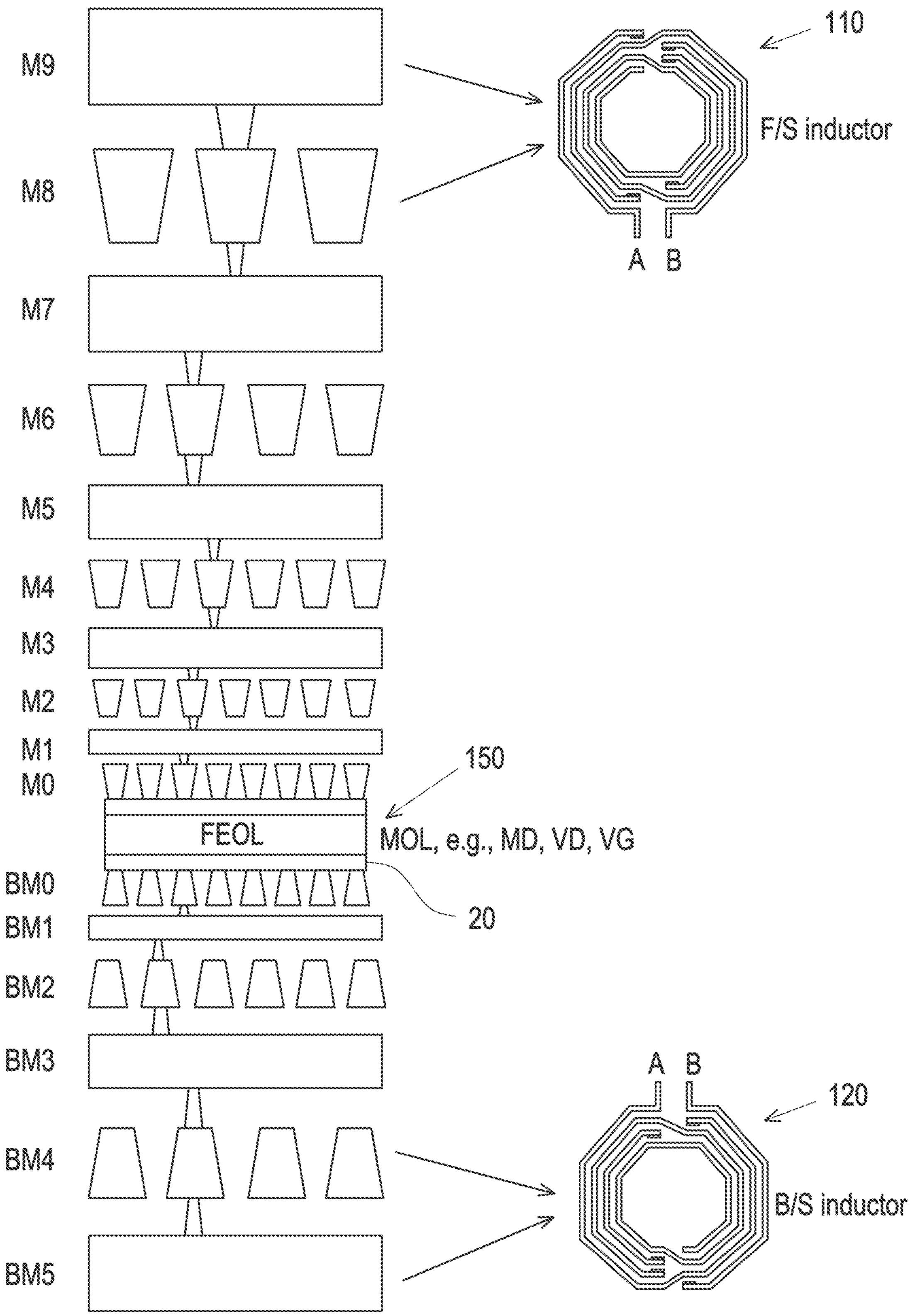
FIG. 2 is a schematic cross-sectional view of an integrated circuit having an LC oscillator circuit, in accordance with some embodiments.
Figure 3:
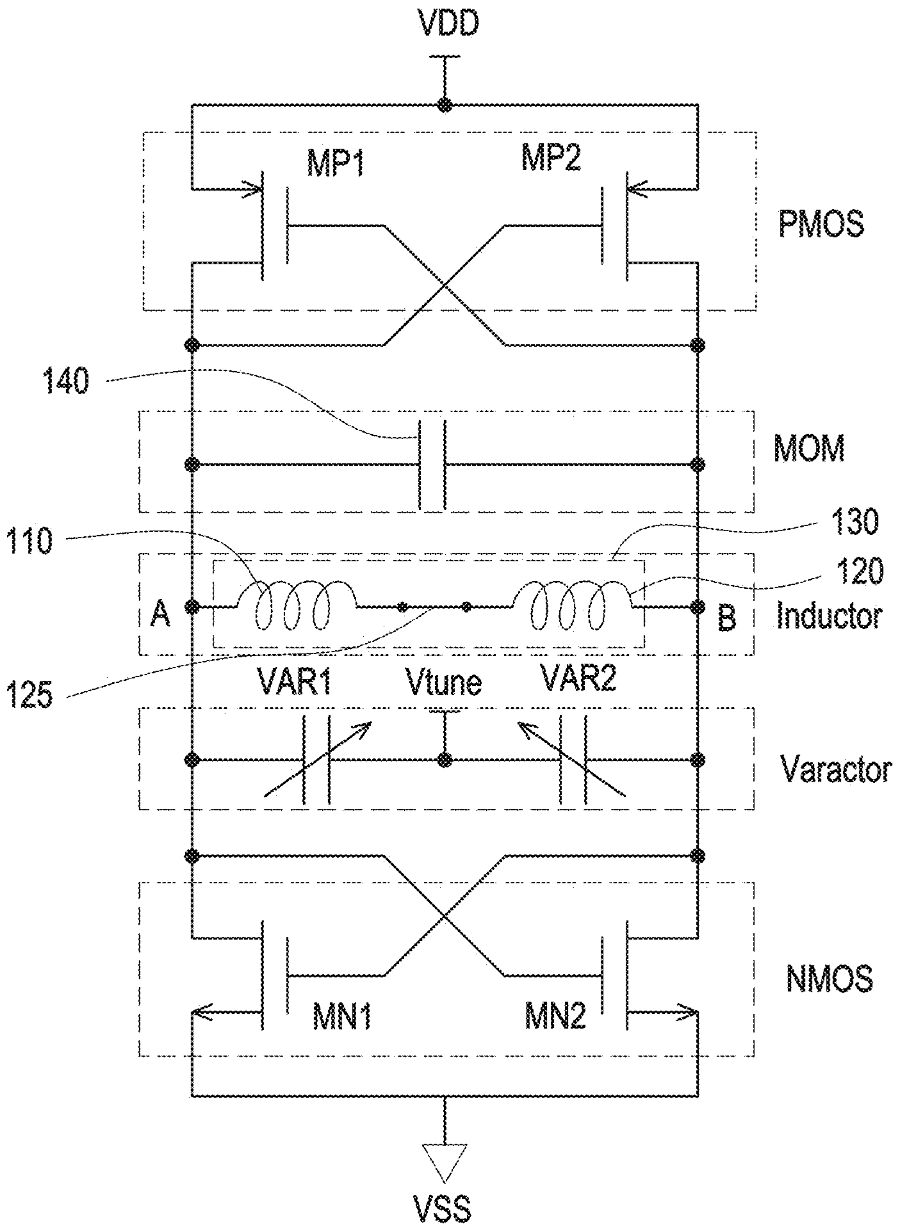
FIG. 3 is a circuit diagram of the LC oscillator circuit of FIG. 1A, in accordance with some embodiments.

FIG. 2 is a schematic cross-sectional view of an integrated circuit having an LC oscillator circuit 100 of FIG. 1A, in accordance with some embodiments. FIG. 3 is a circuit diagram of the LC oscillator circuit 100 of FIG. 1A, in accordance with some embodiments.

In FIG. 2, the stacked transistors in the FEOL element 150 are fabricated on the front side of a substrate 20. The integrated circuit includes multiple front-side metal layers above the stacked transistors at the front side of the substrate (such as, the ten metal layers M0-M9). The integrated circuit also includes multiple back-side metal layers at the back side of the substrate (such as, the six metal layers BM0-BM5). Various conducting lines such as routing lines are fabricated in the front-side metal layers and the back-side metal layers. Conducting lines in different metal layers are connected with via-connectors.

In FIG. 2, the front-side inductor 110 of FIG. 1A is formed with conductors in one or more front-side upper metal layers (such as the metal layers M8-M9). The front-side upper metal layers (such as the metal layers M8-M9) at the front side of the substrate are metal layers which are above at least two other front-side metal layers (such as the metal layers M0-M7). The back-side inductor 120 of FIG. 1A is formed with conductors in one or more back-side lower metal layers (such as the metal layers BM4-BM5). The back-side lower metal layers (such as the metal layers BM4-BM5) at the back side of the substrate are metal layers which are below at least two other back-side metal layers (such as the metal layers BM0-BM3). In some embodiments, the capacitive element 140 is formed with one or more Metal-Oxide-Metal capacitors ("MOM capacitors") in the front-side middle conductive layers (such as the metal layers M0-M7) above the FEOL element 150 or formed with one or more MOM capacitors in the back-side middle conductive layers (such as the metal layers BM0-BM3) at the back-side of the substrate. In some embodiments, some of the MOM capacitors at the front-side of the substrate and at the back-side of the substrate are connected in parallel.

In the circuit diagram of FIG. 3, the LC oscillator circuit 100 includes two p-type transistors MP1 and MP2, two n-type transistors MN1 and MN2, and two varactors VAR1 and VAR2, which are all implemented as parts of the FEOL element 150 in FIGS. 1A-1B. The p-type transistors are PMOS transistors, and the n-type transistors are NMOS transistors. The source terminals of the p-type transistors MP1 and MP2 are connected to an upper power supply Vdd, and the source terminals of the n-type transistors MN1 and MN2 are connected to a lower power supply Vss. The drain terminal of the p-type transistor MP1 and the drain terminal of the n-type transistor MN1 are connected together at a connection node "A." The drain terminal of the p-type transistor MP2 and the drain terminal of the n-type transistor MN2 are connected together at a connection node "B." The gate of the p-type transistor MP1 and the gate of the n-type transistor MN1 are connected to the connection node "B". The gate of the p-type transistor MP2 and the gate of the n-type transistor MN2 are connected to the connection node "A."

The capacitive element 140 is connected between the connection node "A" and the connection node "B." The front-side inductor 110 and the back-side inductor 120 are connected in series and form a combined inductor 130, which is also connected between the connection node "A" and the connection node "B." The front-side inductor 110 is connected to the back-side inductor 120 through a pass-through conductive element 125 which passes through at least the substrate 20. In some embodiments, to connect the front-side inductor 110 to the back-side inductor 120, the pass-through conductive element 125 passes through the front-side middle conductive layers, various layers for forming the FEOL element 150, the substrate 20, and the back-side middle conductive layers.

In the circuit diagram of FIG. 3, a tuning node Vtune is connected to both the varactor VAR1 and the varactor VAR2. The varactor VAR1 is connected between the connection node "A" and the tuning node Vtune. The varactor VAR2 is connected between the connection node "B" and the tuning node Vtune. The tuning node Vtune is configured to receive a tuning voltage. The oscillation frequency of the LC oscillator circuit 100 depends on the inductance of the combined inductor 130, the capacitance of the capacitive element 140, and the capacitance of each of the varactors VAR1 and VAR2. When the tuning voltage applied to the tuning node Vtune changes, the capacitance of each of the varactors VAR1 and VAR2 changes accordingly, and the oscillation frequency of the LC oscillator circuit changes as well.

The arrangements of various components in the FEOL element 150 are depicted in FIGS. 1A-1B. The FEOL element 150 are formed based on p-type active-region semiconductor structures 82P and 84P extending in the X-direction and based on n-type active-region semiconductor structures 82N and 84N extending in the X-direction. The X-direction, the Y-direction, and the Z-direction in FIGS. 1A-1B are mutually orthogonal to each other and form an orthogonal coordinate frame. The p-type active-region semiconductor structure 82P and the n-type active-region semiconductor structure 82N are stacked with each other at the front side of the substrate 20 (which is shown in FIG. 2). The p-type active-region semiconductor structure 84P and the n-type active-region semiconductor structure 84N are stacked with each other at the front side of the substrate 20 (which is shown in FIG. 2). The n-type active-region semiconductor structures 82N and 84N are shifted correspondingly from the p-type active-region semiconductor structures 82P and 84P along the Z-direction.

In some embodiments, the p-type active-region semiconductor structure 82P is between the n-type active-region semiconductor structure 82N and the substrate 20, and the p-type active-region semiconductor structure 84P is between the n-type active-region semiconductor structure 84N and the substrate 20. In some alternative embodiments, the n-type active-region semiconductor structure 82N is between the p-type active-region semiconductor structure 82P and the substrate 20, and the n-type active-region semiconductor structure 84N is between the p-type active-region semiconductor structure 84P and the substrate 20.

In FIGS. 1A-1B, the p-type transistor MP1 is formed in the p-type active-region semiconductor structure 82P, the n-type transistor MN1 is formed in the n-type active-region semiconductor structure 82N, the p-type transistor MP2 is formed in the p-type active-region semiconductor structure 84P, and the n-type transistor MN2 is formed in the n-type active-region semiconductor structure 84N. The varactor VAR1 includes two parallelly connected varactors: one of the varactors (as a part of the varactor VAR1) is formed with the p-type active-region semiconductor structure 82P, and the other one of the varactors (as a part of the varactor VAR1) is formed with the n-type active-region semiconductor structure 82N. The varactor VAR2 includes two parallelly connected varactors: one of the varactors (as a part of the varactor VAR2) is formed with the p-type active-region semiconductor structure 84P, and the other one of the varactors (as a part of the varactor VAR2) is formed with the n-type active-region semiconductor structure 84N.

In some embodiments, the p-type active-region semiconductor structures 82P and 84P and the n-type active-region semiconductor structures 82N and 84N are formed with nano-sheets; consequently, the p-type transistors MP1 and MP2 and the n-type transistors MN1 and MN2 are nano-sheet transistors. In some embodiments, the p-type active-region semiconductor structures 82P and 84P and the n-type active-region semiconductor structures 82N and 84N are formed with nano-wires; consequently, the p-type transistors MP1 and MP2 and the n-type transistors MN1 and MN2 are nano-wire transistors.

In FIGS. 1A-1B, each of the gate-conductor gMP1, the terminal-conductor sMP1, and the terminal-conductor dMP1 intersects the p-type active-region semiconductor structure 82P, whereby correspondingly forming the gate terminal, the source terminal, and the drain terminal of the p-type transistor MP1. Each of the gate-conductor gMN1, the terminal-conductor sMN1, and the terminal-conductor dMN1 intersects the n-type active-region semiconductor structure 82N, whereby correspondingly forming the gate terminal, the source terminal, and the drain terminal of the n-type transistor MN1. The gate-conductor gMP1 and the gate-conductor gMN1 are conductively connected together. The terminal-conductor dMP1 and the terminal-conductor dMN1 are also conductively connected together.

The gate-conductor gVAR1*p* and the gate-conductor gVAR1*n* intersect correspondingly the p-type active-region semiconductor structure 82P and the n-type active-region semiconductor structure 82N. The gate-conductor gVAR1*p*, the gate-conductor gVAR1*n*, the terminal-conductor dMP1, and the terminal-conductor dMN1 are connected together, whereby forming a first terminal of the varactor VAR1. Consequently, the first terminal of the varactor VAR1 is connected to the drain terminals of the p-type transistor MP1 and the n-type transistor MN1. The terminal-conductor sVAR1*p* and the terminal-conductor sVAR1*n* intersect correspondingly the p-type active-region semiconductor structure 82P and the n-type active-region semiconductor structure 82N. The terminal-conductor sVAR1*p* and the terminal-conductor sVAR1*n* are connected together, whereby forming a second terminal of the varactor VAR1. The second terminal of the varactor VAR1 is configured to receive a tuning voltage.

Furthermore, in FIGS. 1A-1B, each of the gate-conductor gMP2, the terminal-conductor sMP2, and the terminal-conductor dMP2 intersects the p-type active-region semiconductor structure 84P, whereby correspondingly forming the gate terminal, the source terminal, and the drain terminal of the p-type transistor MP2. Each of the gate-conductor gMN2, the terminal-conductor sMN2, and the terminal-conductor dMN2 intersects the n-type active-region semiconductor structure 84N, whereby correspondingly forming the gate terminal, the source terminal, and the drain terminal of the n-type transistor MN2. The gate-conductor gMP2 and the gate-conductor gMN2 are conductively connected together. The terminal-conductor dMP2 and the terminal-conductor dMN2 are also conductively connected together.

The gate-conductor gVAR2*p* and the gate-conductor gVAR2*n* intersect correspondingly the p-type active-region semiconductor structure 84P and the n-type active-region semiconductor structure 84N. The gate-conductor gVAR2*p*, the gate-conductor gVAR2*n*, the terminal-conductor dMP2, and the terminal-conductor dMN2 are connected together, whereby forming a first terminal of the varactor VAR2. Consequently, the first terminal of the varactor VAR2 is connected to the drain terminals of the p-type transistor MP2 and the n-type transistor MN2. The terminal-conductor sVAR2*p* and the terminal-conductor sVAR2*n* intersect correspondingly the p-type active-region semiconductor structure 84P and the n-type active-region semiconductor structure 84N. The terminal-conductor sVAR2*p* and the terminal-conductor sVAR2*n* are connected together, whereby forming a second terminal of the varactor VAR2. The second terminal of the varactor VAR2 is configured to receive a tuning voltage.

Additionally, in FIGS. 1A-1B, the gate-conductor gMP2 and the gate-conductor gMN2 are conductively connected to the gate-conductor gVAR1*p* and the gate-conductor gVAR1*n*, which forms the connection node "A." The gate-conductor gMP1 and the gate-conductor gMN1 are conductively connected to the gate-conductor gVAR2*p* and the gate-conductor gVAR2*n*, which forms the connection node "B."

In FIGS. 1A-1B, the first terminal 141 of the capacitive element 140 is connected to the connection node "A", while the second terminal 142 of the capacitive element 140 is connected to the connection node "B". The first terminal 111 of the front-side inductor 110 is connected to the connection node "A". The second terminal 112 of the front-side inductor 110 is connected to a first terminal 121 of the back-side inductor 120. The second terminal 122 of the back-side inductor 120 is connected to the connection node "B".

The FEOL element 150 in FIGS. 1A-1B is disclosed as an example. Other implementations of FEOL element 150 based on the p-type active-region semiconductor structures 82P and 84P and the n-type active-region semiconductor structures 82N and 84N are within the contemplated scope of the present disclosure. Another example implementation of the FEOL element 150 is shown in FIG. 4 and FIGS. 5A-5E.

Figure 4:
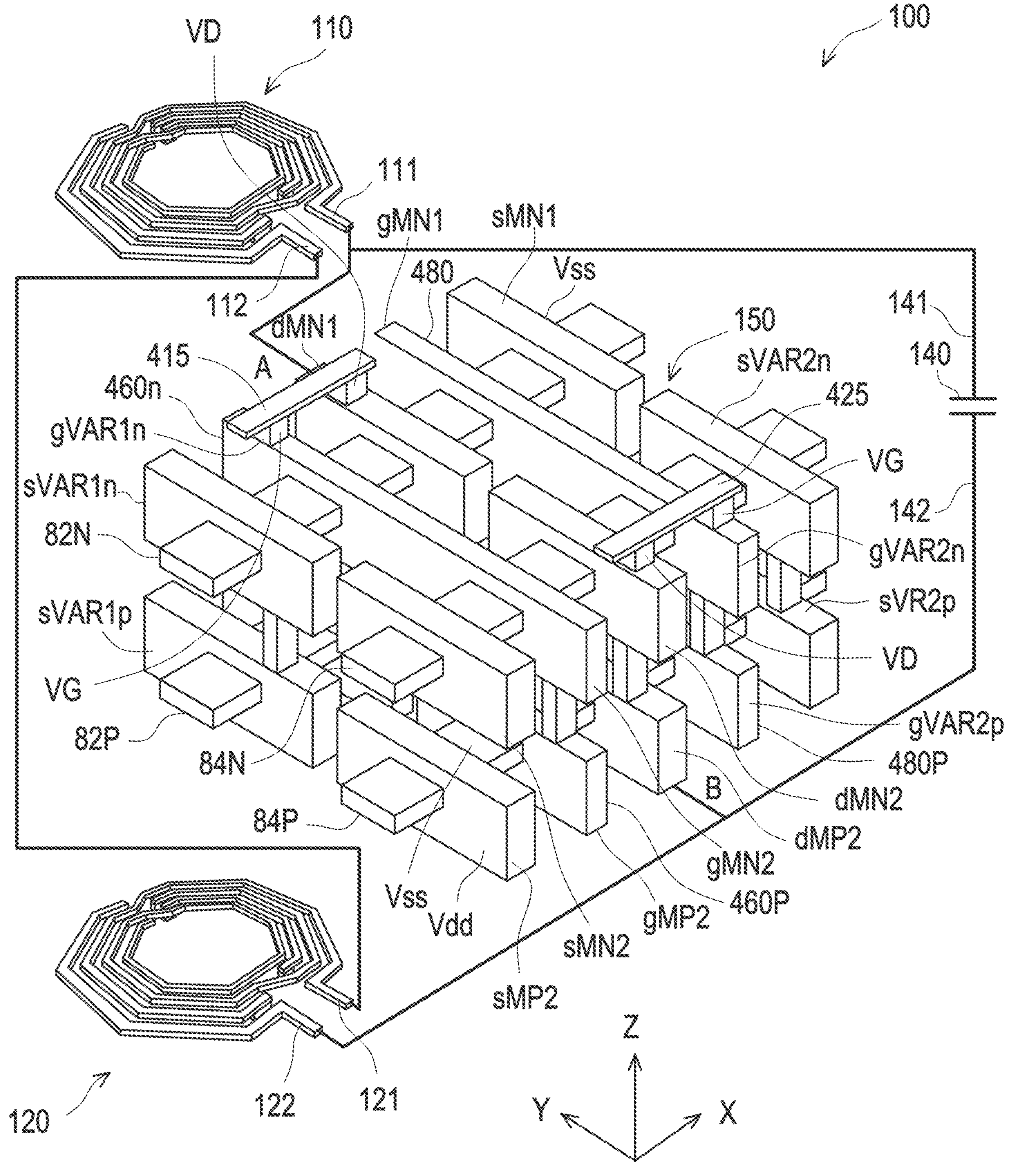
FIG. 4 is a schematic drawing of an LC oscillator circuit, in accordance with some embodiments.

FIG. 4 is a schematic drawing of an LC oscillator circuit 100 based on inductors in both the front-side and the back-side of a substrate and based on stacked transistors in the front-side of the substrate, in accordance with some embodiments. The FEOL element 150 in FIG. 4 is a modification of the FEOL element 150 in FIGS. 1A-1B. The gate-conductor gMN1 and the gate-conductor gVAR2*n* in FIGS. 1A-1B are joined together as a gate-conductor 480*n* in FIG. 4. The gate-conductor gMP1 and the gate-conductor gVAR2*p* in FIGS. 1A-1B are joined together as a gate-conductor 480*p* in FIG. 4. The gate-conductor 480*n* and the gate-conductor 480*p* are conductively connected together. Furthermore, the gate-conductor gMN2 and the gate-conductor gVAR1*n* in FIGS. 1A-1B are joined together as a gate-conductor 460*n* in FIG. 4. The gate-conductor gMP2 and the gate-conductor gVAR1*p* in FIGS. 1A-1B are joined together as a gate-conductor 460*p* in FIG. 4. The gate-conductor 460*n* and the gate-conductor 460*p* are conductively connected together.

In FIG. 4, an intra-cell conductor 415 conductively connects the gate-conductor 460*n* to the terminal-conductor dMN1 through via-connectors VG and VD underneath the intra-cell conductor 415, and an intra-cell conductor 425 conductively connects the gate-conductor 480*n* to the terminal-conductor dMN2 through via-connectors VG and VD underneath the intra-cell conductor 425. In some embodiments, the intra-cell conductor 415 and the intra-cell conductor 425 are fabricated in a metal layer above the n-type active-region semiconductor structures 82N and 84N. For example, in some embodiments, the intra-cell conductor 415 and the intra-cell conductor 425 are in a first metal layer M0 overlying a layer of interlayer dielectric that covers the n-type active-region semiconductor structures 82N and 84N. Each of the intra-cell conductor 415 and the intra-cell conductor 425 extending in the X-direction has a length which is smaller than the width of the circuit cell containing the FEOL element 150. The width of the circuit cell is measured along the X-direction.

Figure 5A:
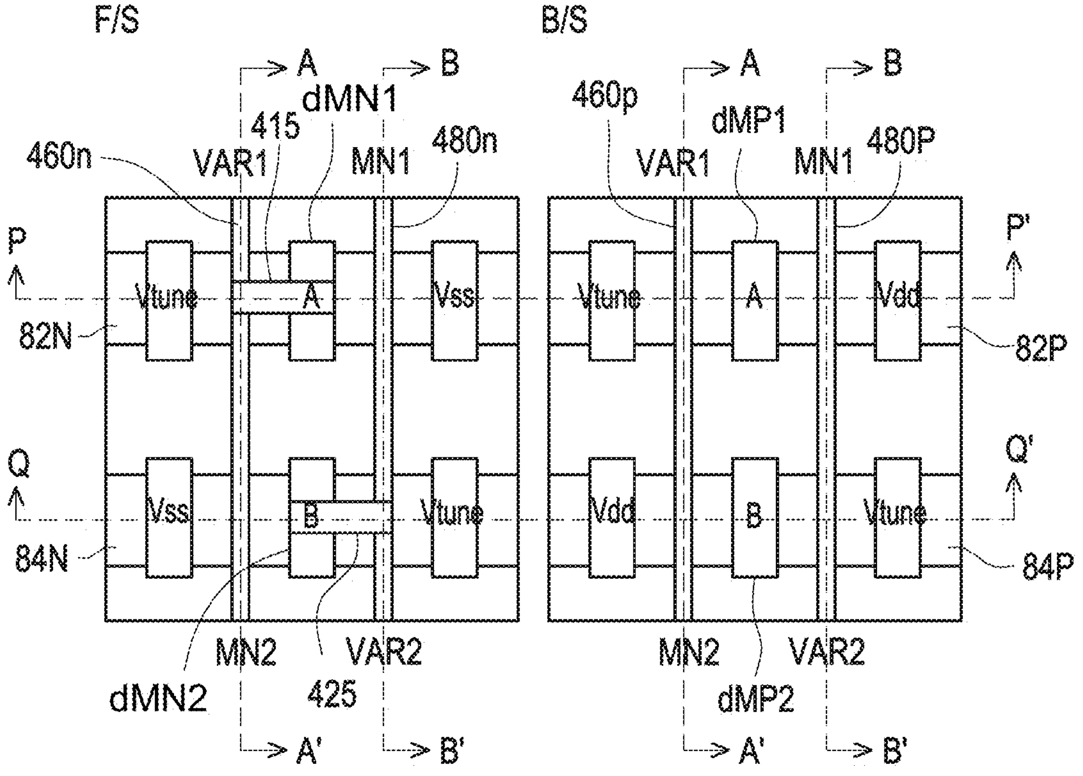
FIG. 5A is a layout diagram of the FEOL element in FIG. 4, in accordance with some embodiments.

FIG. 5A is a layout diagram of the FEOL element 150 in FIG. 4, in accordance with some embodiments. FIGS. 5B-5E are cross-sectional views of the FEOL element 150 of FIG. 5A along various cutting planes, in accordance with some embodiments. Each of the gate-conductors 460*n* and 480*n* intersects both of the n-type active-region semiconductor structures 82N and 84N. Each of the gate-conductors 460*p* and 480*p* intersects both of the p-type active-region semiconductor structures 82P and 84P. The gate-conductors 460*n* and 460*p* are conductively connected together (as shown in the correctional-view of FIG. 4). The gate-conductors 480*n* and 480*p* are also conductively connected together (as shown in the correctional-view of FIG. 4).

The drain terminals (i.e., dMN1 and dMP1) of the n-type transistor MN1 and the p-type transistor MP1 are conductively connected to the gate-conductors 460*n* and 460*p* through the intra-cell conductor 415 above the n-type active-region semiconductor structures 82N. The drain terminals (i.e., dMN2 and dMP2) of the n-type transistor MN2 and the p-type transistor MP2 are conductively connected to the gate-conductors 480*n* and 480*p* through the intra-cell conductor 425 above the n-type active-region semiconductor structures 84N.

The source terminals of the n-type transistors MN1 and MN2 are configured to be maintained at a lower supply voltage Vss. The source terminals of the p-type transistors MP1 and MP2 are configured to be maintained at an upper supply voltage Vdd. Each of the second terminal of the varactor VAR1 and the second terminal of the varactor VAR1 is configured to receive the tuning voltage.

Figure 5B:
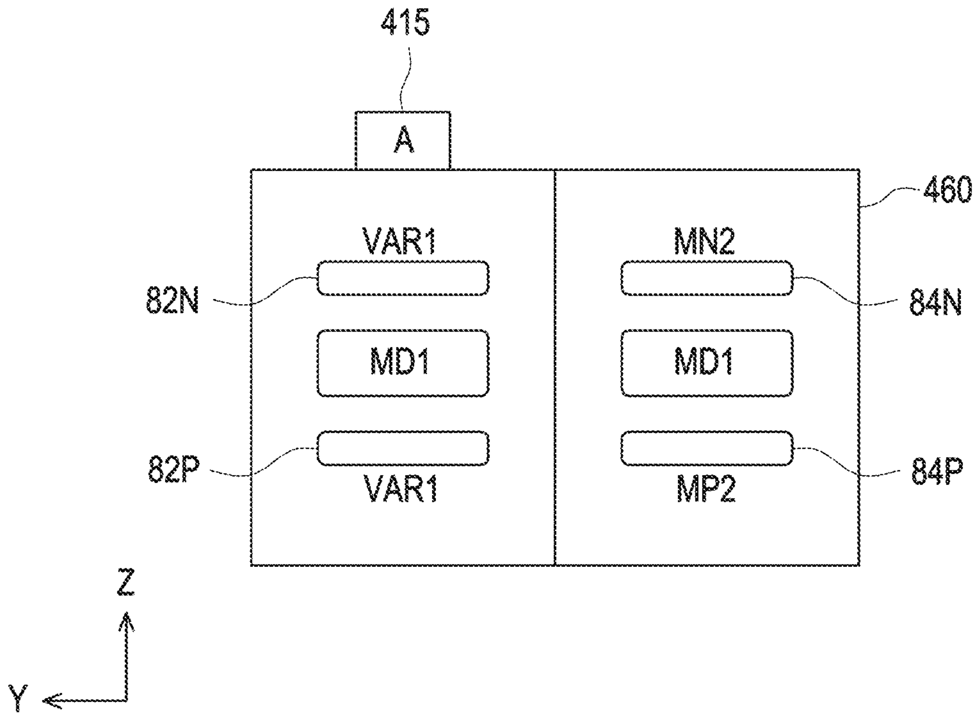
FIGS. 5B-5E are cross-sectional views of the FEOL element of FIG. 5A along various cutting planes, in accordance with some embodiments.

FIG. 5B is a cross-sectional view of the FEOL element 150 of FIG. 5A along the AA' cutting plane, in accordance with some embodiments. As shown in FIG. 5B, the varactor VAR1 is formed with the n-type active-region semiconductor structure 82N and the p-type active-region semiconductor structure 82P, the n-type transistor MN2 is formed with the n-type active-region semiconductor structure 84N, and the p-type transistor MP2 is formed with the p-type active-region semiconductor structure 84P. A gate-conductor 460 (which is a combination of the gate-conductors 460*n* and 460*p* in FIG. 4 and FIG. 5A) intersects each of the n-type active-region semiconductor structures 82N and 84N and the p-type active-region semiconductor structures 82P and 84P. The intra-cell conductor 415 (which is at the connection node "A") is connected to the gate-conductor 460.

Figure 5C:
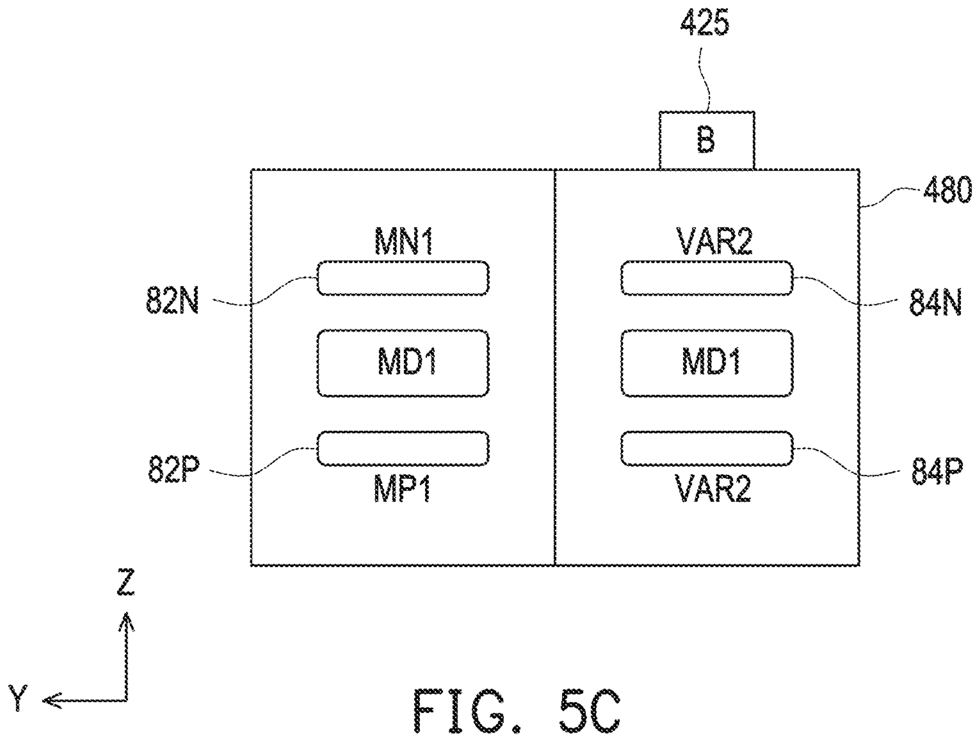

FIG. 5C is a cross-sectional view of the FEOL element 150 of FIG. 5A along the BB' cutting plane, in accordance with some embodiments. As shown in FIG. 5C, the n-type transistor MN1 is formed with the n-type active-region semiconductor structures 82N, the p-type transistor MP1 is formed with the p-type active-region semiconductor structures 82P, and the varactor VAR2 is formed with the n-type active-region semiconductor structure 84N and the p-type active-region semiconductor structure 84P. A gate-conductor 480 (which is a combination of the gate-conductors 480*n* and 480*p* in FIG. 4 and FIG. 5A) intersects each of the n-type active-region semiconductor structures 82N and 84N and the p-type active-region semiconductor structures 82P and 84P. The intra-cell conductor 425 (which is at the connection node "B") is connected to the gate-conductor 480.

In FIG. 5B and FIG. 5C, the n-type active-region semiconductor structures 82N is stacked with the p-type active-region semiconductor structures 82P, and the n-type active-region semiconductor structures 84N is stacked with the p-type active-region semiconductor structures 84P. Furthermore, because of insulation regions MDI, the n-type active-region semiconductor structures 82N and the p-type active-region semiconductor structures 82P are insulated from each other, and the n-type active-region semiconductor structures 84N and the p-type active-region semiconductor structures 84P are insulated from each other.

Figure 5D:
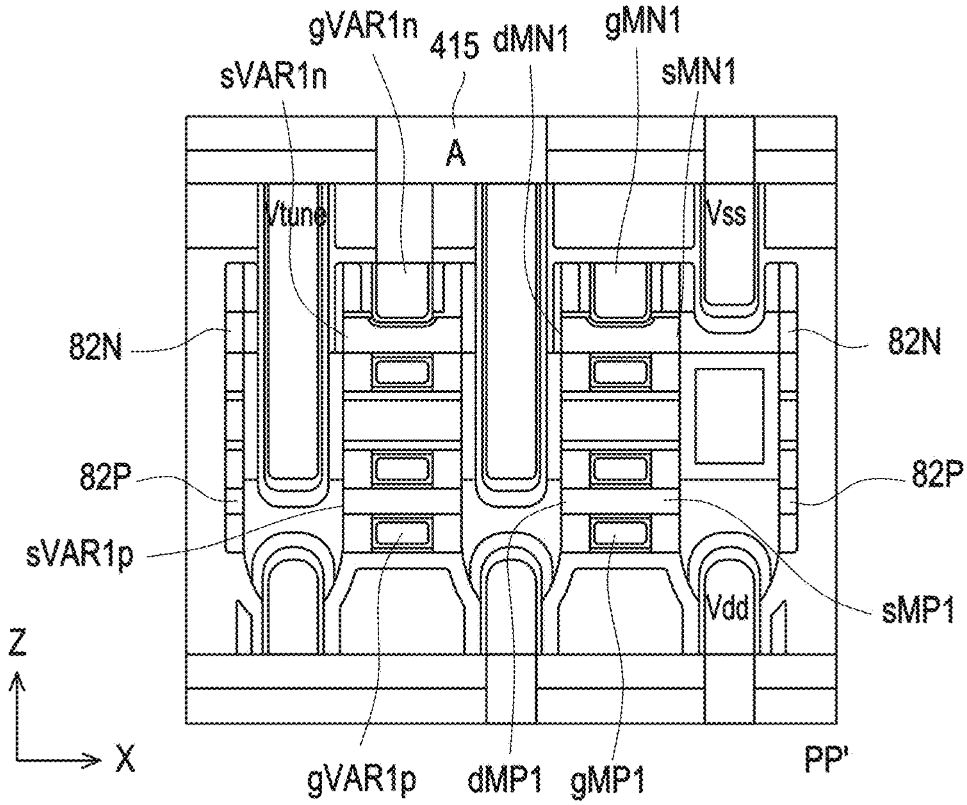

FIG. 5D is a cross-sectional view of the FEOL element 150 of FIG. 5A along the PP' cutting plane, in accordance with some embodiments. The gate-conductors gVAR1*n* and gVAR1*p* (which are parts of the gate-conductor 460 in FIG. 5A) are connected to the intra-cell conductor 415 (which is at the connection node "A"). The gate-conductors gMN1 and gMP1 (which are parts of the gate-conductor 480 in FIG. 5A) are correspondingly the gate terminals of the n-type transistor MN1 and the p-type transistor MP1. The drain terminal dMN1 of the n-type transistor MN1 and the drain terminal dMP1 of the p-type transistor MP1 are connected to the intra-cell conductor 415. The source terminal sMN1 of the n-type transistor MN1 and source terminal sMP1 of the p-type transistor MP1 are configured to receive correspondingly the lower supply voltage Vss and the upper supply voltage Vdd. The second terminal (formed with terminal conductors sVAR1*n* and pVAR1*p*) of the varactor VAR1 is configured to receive the tuning voltage Vtune.

Figure 5E:
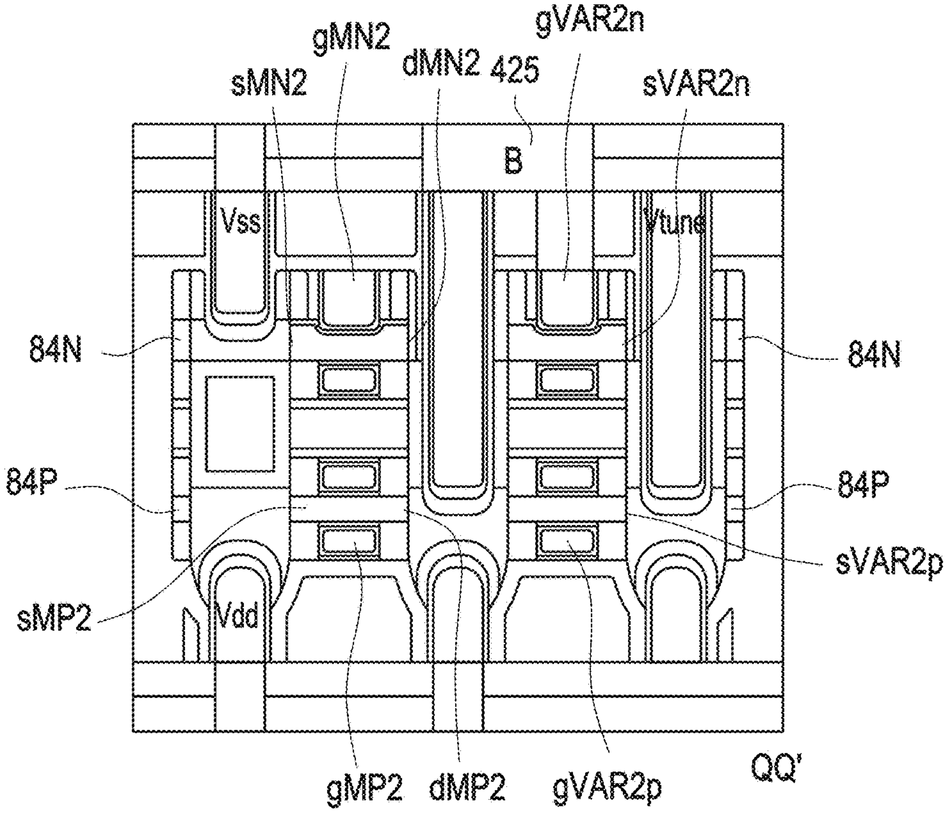

FIG. 5E is a cross-sectional view of the FEOL element 150 of FIG. 5A along the QQ' cutting plane, in accordance with some embodiments. The gate-conductors gVAR2*n* and gVAR2*p* (which are parts of the gate-conductor 480 in FIG. 5A) are connected to the intra-cell conductor 425 (which is at the connection node "B"). The gate-conductors gMN2 and gMP2 (which are parts of the gate-conductor 460 in FIG. 5A) are correspondingly the gate terminals of the n-type transistor MN2 and the p-type transistor MP2. The drain terminal dMN2 of the n-type transistor MN2 and the drain terminal dMP2 of the p-type transistor MP2 are connected to the intra-cell conductor 425. The source terminal sMN2 of the n-type transistor MN2 and source terminal sMP2 of the p-type transistor MP1 are configured to receive correspondingly the lower supply voltage Vss and the upper supply voltage Vdd. The second terminal (formed with terminal conductors sVAR2*n* and pVAR2*p*) of the varactor VAR2 is configured to receive the tuning voltage Vtune.

In the layout diagram of FIG. 5A, the connection node "A" includes an intra-cell conductor 415 conductively connecting the gate-conductor 460*n* to the terminal-conductor dMN1 through via-connectors VG and VD underneath the intra-cell conductor 415, and the connection node "B" includes an intra-cell conductor 425 conductively connecting the gate-conductor 480*n* to the terminal-conductor dMN2 through via-connectors VG and VD underneath the intra-cell conductor 425. Other implementations of the connection node "A" and the connection node "B" are within the contemplated scope of present disclosure.

Figure 6A:
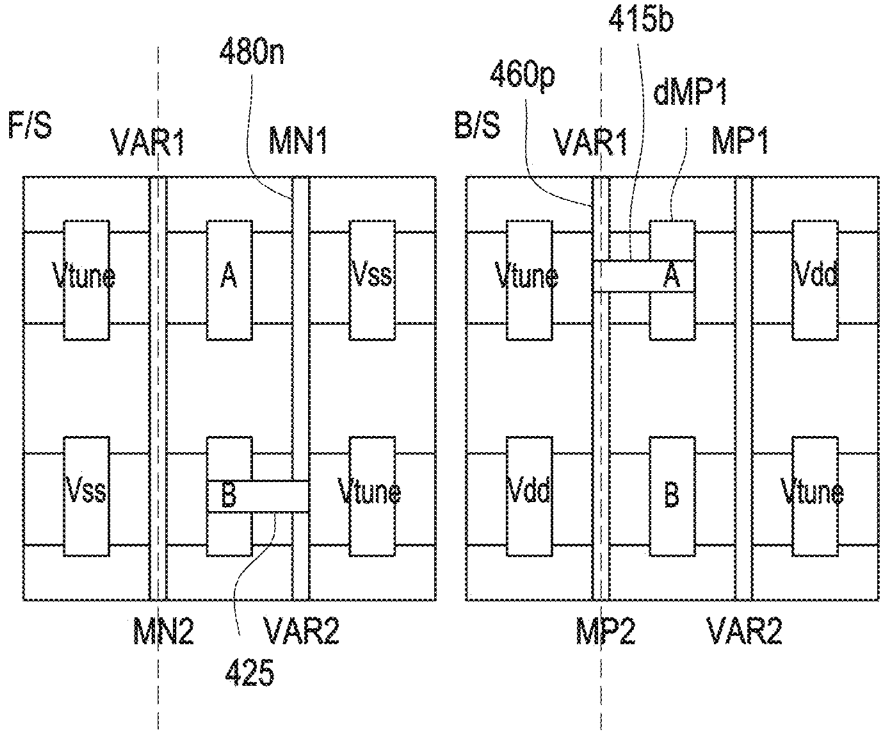
FIGS. 6A-6B are layout diagrams of the FEOL element, in accordance with some embodiments.
Figure 6B:
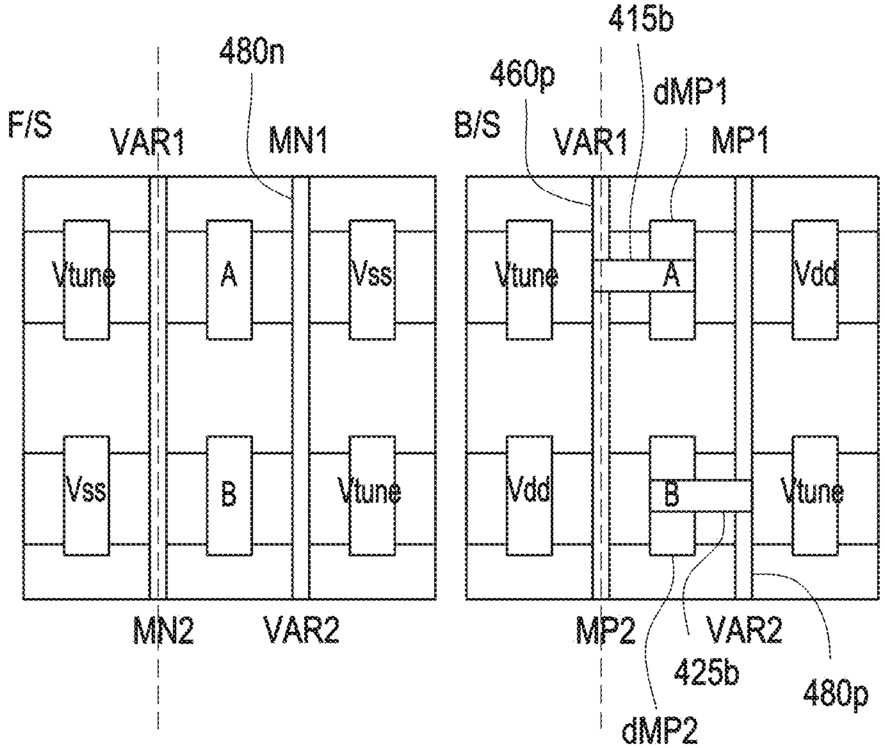

FIGS. 6A-6B are layout diagrams of the FEOL element 150, which are variations of the layout diagram of FIG. 5A, in accordance with some embodiments. The connection node "A" in the layout diagram of FIG. 6A is implemented differently than the connection node "A" in the layout diagram of FIG. 5A. In FIG. 6A, the connection node "A" includes an intra-cell conductor 415*b* at the backside of the substrate. The intra-cell conductor 415*b* conductively connects the gate-conductor 460*p* to the terminal-conductor dMP1 through via-connectors BVG and BVD at the back-side of the substrate. In some embodiments, the intra-cell conductor 415*b* is in a first metal layer BM0 below the substrate. The intra-cell conductor 415*b* extending in the X-direction has a length which is smaller than the width of the circuit cell containing the FEOL element 150.

In FIG. 6B, each of the connection node "A" and the connection node "B" is implemented differently than the corresponding the connection node "A" or "B" in FIG. 5A. The connection node "A" in FIG. 6B (which has the same implementation as the connection node "A" in FIG. 6A) is implemented differently than the connection node "B" in FIG. 5A, because the intra-cell conductor 415 (in FIG. 5A) in the front of the substrate is substituted with the intra-cell conductor 415*b* (in FIG. 6B) at the back of the substrate. The connection node "B" in FIG. 6B is implemented differently than the connection node "B" in FIG. 5A, because the intra-cell conductor 425 (in FIG. 5A) in the front of the substrate is substituted with the intra-cell conductor 425*b* (in FIG. 6B) at the back of the substrate. The intra-cell conductor 425*b* conductively connects the gate-conductor 480*p* to the terminal-conductor dMP2 through via-connectors BVG and BVD at the backside of the substrate. In some embodiments, the intra-cell conductor 425*b* is in a first metal layer BM0 below the substrate. The intra-cell conductor 425*b* extending in the X-direction has a length which is smaller than the width of the circuit cell containing the FEOL element 150.

Figure 7A:
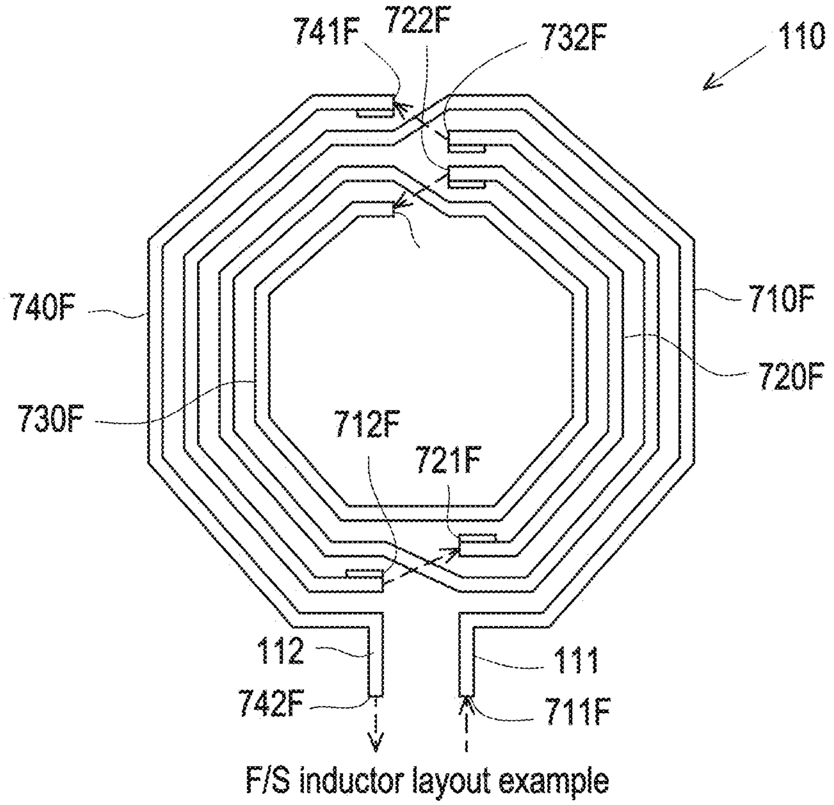
FIGS. 7A-7B are layout diagrams of the front-side inductor and the back-side inductor, in accordance with some embodiments.

FIG. 7A is a layout diagram of the front-side inductor 110, in accordance with some embodiments. The front-side inductor 110 includes conductors 710F-740F in a front-side upper metal layer. The conductors 710F-740F are serially connected and form a spiral coil. In one example embodiments, each of the conductors 710F-740F is in the front-side metal layer M9 (as shown in FIG. 2). The serial connection between a pair of conductors in the front-side metal layer M9 is provided by conductor segments in the front-side metal layer M8 and via-connectors between the front-side metal layers M9 and M8. A first terminal 711F of the conductor 710F is configured as the first terminal 111 of the front-side inductor 110. A second terminal 712F of the conductor 710F is serially connected to a first terminal 721F of the conductor 720F. A second terminal 722F of the conductor 720F is serially connected to a first terminal 731F of the conductor 730F. A second terminal 732F of the conductor 730F is serially connected to a first terminal 741F of the conductor 740F. A second terminal 742F of the conductor 740F is configured as the second terminal 112 of the front-side inductor 110.

In the embodiments of FIG. 7A, the front-side inductor 110 includes both conductors (such as 710F-740F) in the front-side metal layer M9 and conductor segments in other front-side metal layers (such as the front-side metal layer M8). The total length of the conductors in the front-side metal layer M9 is larger than the total length of conductor segments in other front-side metal layers. When the inductance due to the conductors (such as 710F-740F) in the front-side metal layer M9 is larger than the self-inductance of the conductor segments in other metal layers, the front-side inductor 110 is dominantly formed with the conductors (such as 710F-740F) in the front-side metal layer M9. In some alternative embodiments, the front-side inductor 110 is also dominantly formed with conductors in the front-side metal layer M9, because the front-side inductor 110 is a spiral coil that is formed entirely from the conductors in a single front-side metal layer. The spiral coil starts with a first terminal (similar to 711F in FIG. 7A) at an outer boundary of the area occupied by the front-side inductor 110. The spiral coil then continues spiraling inwards and finishes with a second terminal (similar to 731F in FIG. 7A) at an inner area surrounded by the conductors of spiral coil. The second terminal at the inner area is configured as the second terminal 112 of the front-side inductor 110, while the first terminal at the outer boundary is configured as the first terminal 111 of the front-side inductor 110.

In the embodiments of FIG. 7A, the area occupied by the front-side inductor 110 is in the shape of an octagon. In alternative embodiments, the area occupied by the front-side inductor 110 is in the shape of a hexagon, rectangular, or a square. Other shapes of the area occupied by the front-side inductor 110 are also within the contemplated scope of the present disclosure.

Figure 7B:
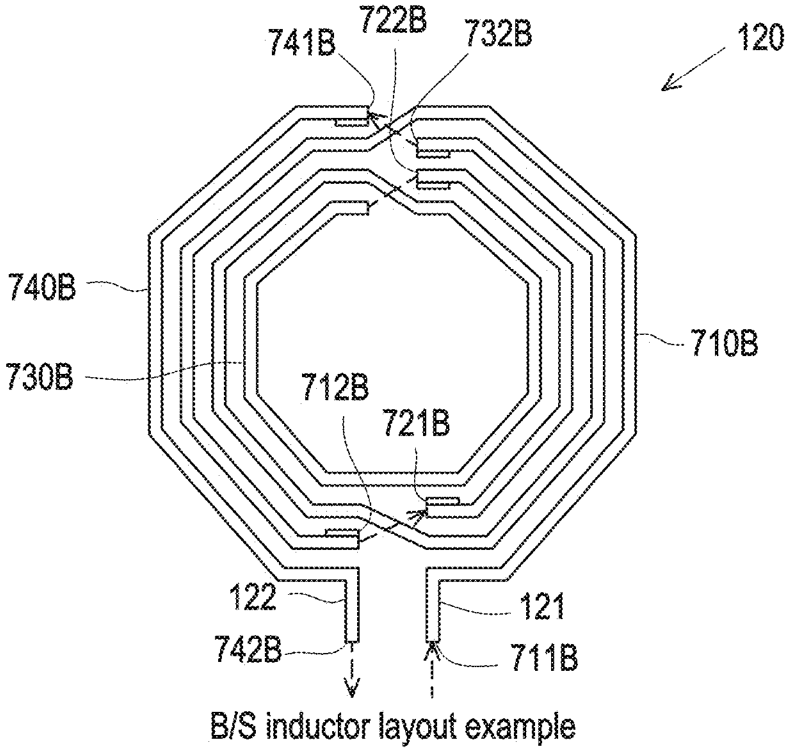

FIG. 7B is a layout diagram of the back-side inductor 120, in accordance with some embodiments. The back-side inductor 120 includes conductors 710B-740B in a back-side lower metal layer. The conductors 710B-740B are serially connected and form a spiral coil. In one example embodiment, each of the conductors 710B-740B is in the back-side metal layer BM5 (as shown in FIG. 2). The serial connection between a pair of conductors in the back-side metal layer BM5 is provided by conductor segments in the back-side metal layer BM4 and via-connectors between the back-side metal layers BM5 and BM4. A first terminal 711B of the conductor 710B is configured as the first terminal 121 of the back-side inductor 120. A second terminal 712B of the conductor 710B is serially connected to a first terminal 721B of the conductor 720B. A second terminal 722B of the conductor 720B is serially connected to a first terminal 731B of the conductor 730B. A second terminal 732B of the conductor 730B is serially connected to a first terminal 741B of the conductor 740B. A second terminal 742B of the conductor 740B is configured as the second terminal 122 of the back-side inductor 120.

In the embodiments of FIG. 7B, the back-side inductor 120 includes both conductors (such as 710B-740B) in the back-side metal layer BM5 and conductor segments in other back-side metal layers (such as the back-side metal layer BM4). The total length of the conductors in the back-side metal layer BM5 is larger than the total length of conductor segments in other back-side metal layers. When the inductance due to the conductors (such as 710B-740B) in the back-side metal layer BM5 is larger than the self-inductance of the conductor segments in other metal layers, the back-side inductor 120 is dominantly formed with the conductors (such as 710B-740B) in the back-side metal layer BM5. In some alternative embodiments, the back-side inductor 120 is also dominantly formed with the conductors (such as 710B-740B) in the back-side metal layer BM5, because the back-side inductor 120 is a spiral coil that is formed entirely from the conductors in a single back-side metal layer. The spiral coil starts with a first terminal (similar to 711B in FIG. 7B) at an outer boundary of the area occupied by the back-side inductor 120. The spiral coil then continues spiraling inwards and finishes with a second terminal (similar to 731B in FIG. 7B) at an inner area surrounded by the conductors of spiral coil. The second terminal at the inner area is configured as the second terminal 122 of the back-side inductor 120, while the first terminal at the outer boundary is configured as the first terminal 121 of the back-side inductor 120.

In the embodiments of FIG. 7B, the area occupied by the back-side inductor 120 is in the shape of an octagon. In alternative embodiments, the area occupied by the back-side inductor 120 is in the shape of a hexagon, rectangular, or a square. Other shapes of the area occupied by the back-side inductor 120 are also within the contemplated scope of the present disclosure.

In some embodiments, the front-side inductor 110 at the frontside of the substrate 20 of FIG. 2 is stacked directly with the back-side inductor 120 at the backside of the substrate 20. In some embodiments of FIG. 1A or FIG. 4, the front-side inductor 110, the n-type transistor MN1, and the p-type transistor MP1 form a stack directly above the back-side inductor 120. In some embodiments of FIG. 1A or FIG. 4, the front-side inductor 110, the n-type transistor MN2, and the p-type transistor MP2 form a stack directly above the back-side inductor 120. When the front-side inductor 110, a first-type transistor, and a second-type transistor on the substrate 20 form a stack directly above the back-side inductor 120, a first surface image of the front-side inductor 110 projected (along the Z-axis) onto a surface of the substrate 20 overlaps with a second surface image of the back-side inductor 120 projected (along the Z-axis) onto the surface of the substrate 20, and the projected images of the first-type transistor and the second-type transistor onto the surface of the substrate 20 are within the overlapped image area between the first surface image of the front-side inductor 110 and the second surface image of the back-side inductor 120.

Figure 8:
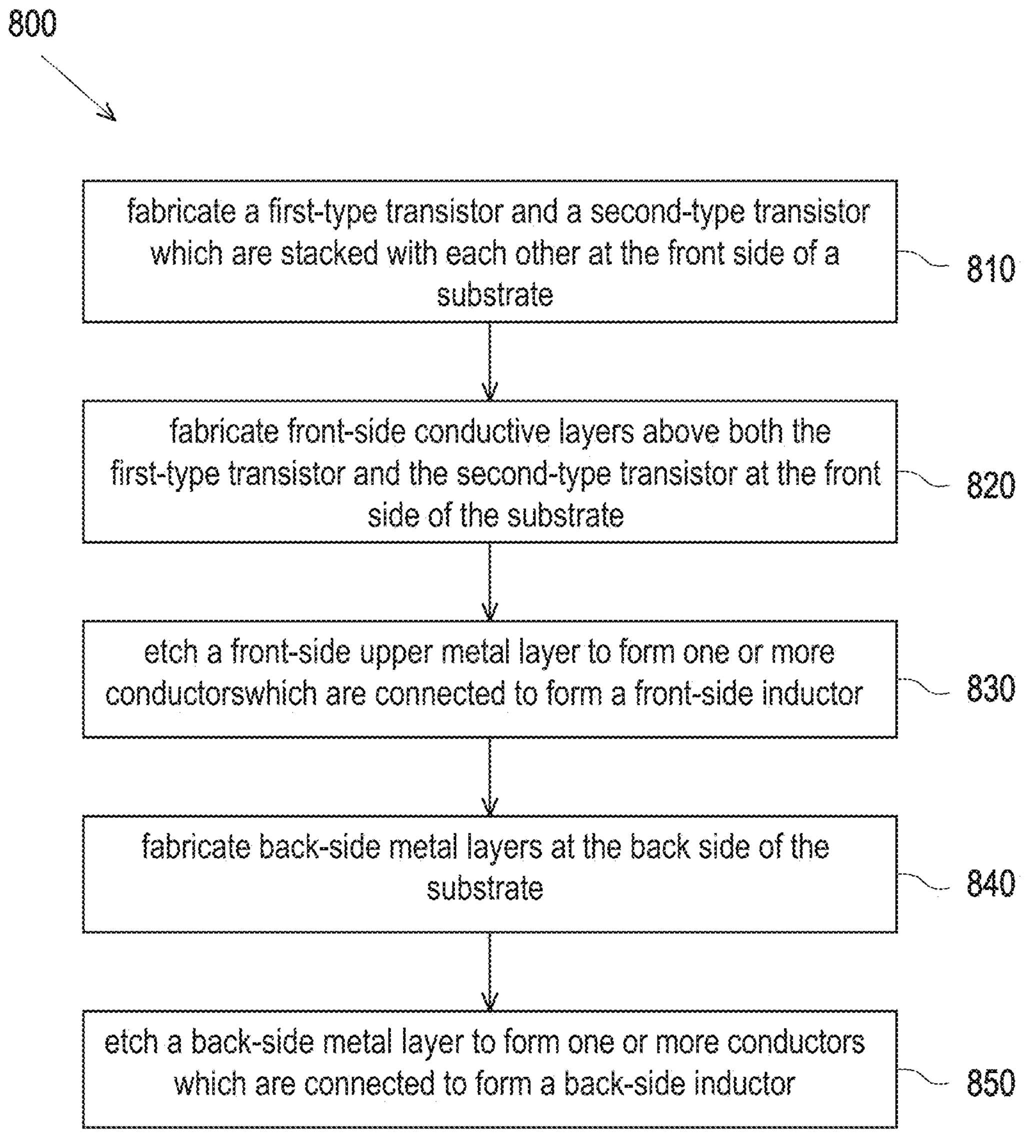
FIG. 8 is a flowchart of a method of manufacturing an integrated circuit (IC) having both a front-side inductor and a back-side inductor, in accordance with some embodiments.

FIG. 8 is a flowchart of a method 800 of manufacturing an integrated circuit (IC) having both a front-side inductor and a back-side inductor, in accordance with some embodiments. It is understood that additional operations may be performed before, during, and/or after the method 800 depicted in FIG. 8, and that some other processes may only be briefly described herein.

In operation 810 of method 800, a first-type transistor and a second-type transistor are fabricated on a substrate, and the first-type transistor and the second-type transistor are stacked with each other at the front side of a substrate. In the embodiments as shown in FIG. 1A, after the p-type active-region semiconductor structure 84P is fabricated on the substrate, the gate-conductors gMP2 and the terminal conductors dMP2 and sMP2 are fabricated. The gate-conductors gMP2 intersects the p-type active-region semiconductor structure 84P at a channel region of the PMOS transistor MP2. The terminal conductors dMP2 and sMP2 intersect the p-type active-region semiconductor structure 84P correspondingly at a drain region and a source region of the PMOS transistor MP2. Then, the n-type active-region semiconductor structure 84N is fabricated on a layer of dielectric material that covers the p-type active-region semiconductor structure 84P. The gate-conductors gMN2 and the terminal conductors dMN2 and sMN2 are subsequently fabricated. The gate-conductors gMN2 intersects the n-type active-region semiconductor structure 84N at a channel region of the NMOS transistor MN2. The terminal conductors dMN2 and sMN2 intersect the n-type active-region semiconductor structure 84N correspondingly at a drain region and a source region of the NMOS transistor MN2. The PMOS transistor MP2 and the NMOS transistor MN2 are stacked with each other.

In operation 820 of method 800, front-side conductive layers are fabricated above both the first-type transistor and the second-type transistor at the front side of the substrate. In the embodiments as shown in FIG. 2, front-side conductive layers M0-M9 are fabricated above The PMOS transistor MP2 and the NMOS transistor MN2 in the FEOL element 150. Then, a front-side inductor 110 is fabricated. During the fabrication of the front-side inductor, in operation 830 of method 800, a front-side upper metal layer is etched to form one or more conductors which are connected to form the front-side inductor. In the embodiments as shown in FIG. 2 and FIG. 7A, the front-side upper metal layer M9 is etched to form the conductors 710F-740F which serially are connected to form the front-side inductor 110.

The front side processing performed at operations 810-830 is followed by the back side processing performed at operations 850-850. In some embodiments, the wafer containing the substrate is flipped. In operation 840 of method 800, back-side metal layers are fabricated at the back side of the substrate. Then, in operation 850 of method 800, the back-side metal layer is etched to form one or more conductors which are connected to form a back-side inductor. In the embodiments as shown in FIG. 2 and FIG. 7B, the back-side conductive layers BM0-BM5 are fabricated, and the back-side lower metal layer BM5 is etched to form the conductors 710B-740B which serially are connected to form the back-side inductor 120.

Figure 9:
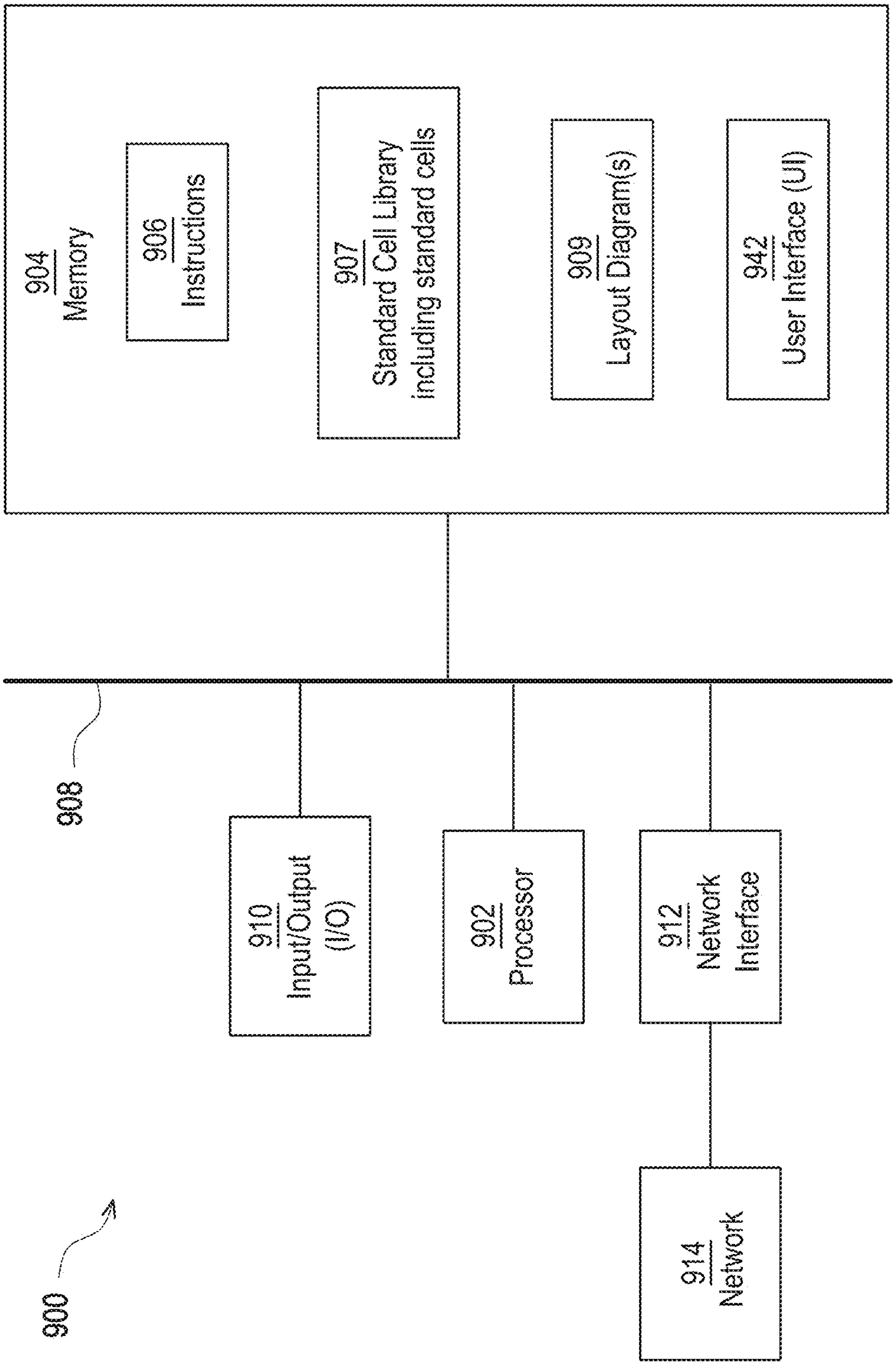
FIG. 9 is a block diagram of an electronic design automation (EDA) system, in accordance with some embodiments.

FIG. 9 is a block diagram of an electronic design automation (EDA) system 900 in accordance with some embodiments.

In some embodiments, EDA system 900 includes an automatic placement and routing (APR) system. Methods described herein of designing layout diagrams represent wire routing arrangements, in accordance with one or more embodiments, are implementable, for example, using EDA system 900, in accordance with some embodiments.

In some embodiments, EDA system 900 is a general purpose computing device including a hardware processor 902 and a non-transitory, computer-readable storage medium 904. Storage medium 904, amongst other things, is encoded with, i.e., stores, computer program code 906, i.e., a set of executable instructions. Execution of instructions 906 by hardware processor 902 represents (at least in part) an EDA tool which implements a portion or all of the methods described herein in accordance with one or more embodiments (hereinafter, the noted processes and/or methods).

Processor 902 is electrically coupled to computer-readable storage medium 904 via a bus 908. Processor 902 is also electrically coupled to an I/O interface 910 by bus 908. A network interface 912 is also electrically connected to processor 902 via bus 908. Network interface 912 is connected to a network 914, so that processor 902 and computer-readable storage medium 904 are capable of connecting to external elements via network 914. Processor 902 is configured to execute computer program code 906 encoded in computer-readable storage medium 904 in order to cause system 900 to be usable for performing a portion or all of the noted processes and/or methods. In one or more embodiments, processor 902 is a central processing unit (CPU), a multi-processor, a distributed processing system, an application specific integrated circuit (ASIC), and/or a suitable processing unit.

In one or more embodiments, computer-readable storage medium 904 is an electronic, magnetic, optical, electromagnetic, infrared, and/or a semiconductor system (or apparatus or device). For example, computer-readable storage medium 904 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 904 includes a compact disk-read only memory (CD-ROM), a compact disk-read/write (CD-R/W), and/or a digital video disc (DVD).

In one or more embodiments, storage medium 904 stores computer program code 906 configured to cause system 900 (where such execution represents (at least in part) the EDA tool) to be usable for performing a portion or all of the noted processes and/or methods. In one or more embodiments, storage medium 904 also stores information which facilitates performing a portion or all of the noted processes and/or methods. In one or more embodiments, storage medium 904 stores library 907 of standard cells including such standard cells as disclosed herein. In one or more embodiments, storage medium 904 stores one or more layout diagrams 909 corresponding to one or more layouts disclosed herein.

EDA system 900 includes I/O interface 910. I/O interface 910 is coupled to external circuitry. In one or more embodiments, I/O interface 910 includes a keyboard, keypad, mouse, trackball, trackpad, touchscreen, and/or cursor direction keys for communicating information and commands to processor 902.

EDA system 900 also includes network interface 912 coupled to processor 902. Network interface 912 allows system 900 to communicate with network 914, to which one or more other computer systems are connected. Network interface 912 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 900.

System 900 is configured to receive information through I/O interface 910. The information received through I/O interface 910 includes one or more of instructions, data, design rules, libraries of standard cells, and/or other parameters for processing by processor 902. The information is transferred to processor 902 via bus 908. EDA system 900 is configured to receive information related to a user interface (UI) through I/O interface 910. The information is stored in computer-readable medium 904 as UI 942.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 900. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 10:
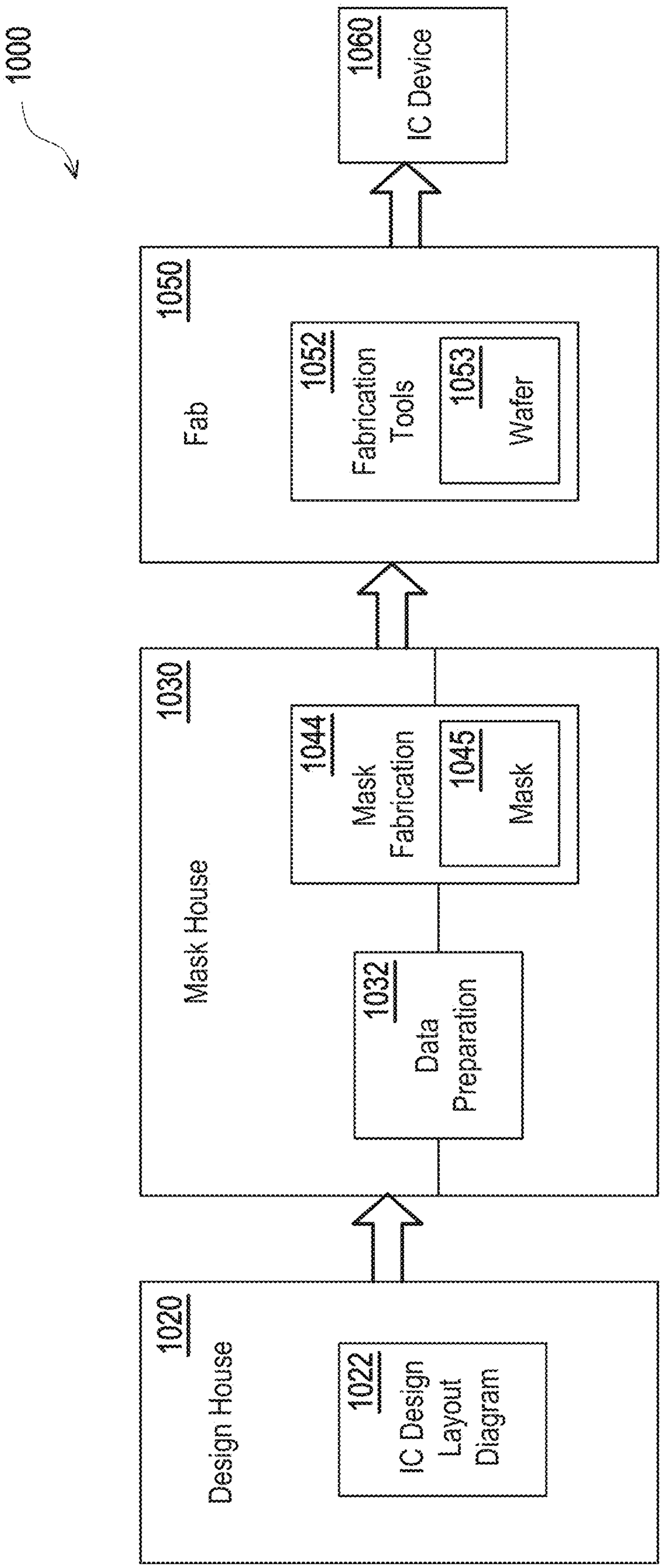
FIG. 10 is a block diagram of an integrated circuit (IC) manufacturing system, and an IC manufacturing flow associated therewith, in accordance with some embodiments.

FIG. 10 is a block diagram of an integrated circuit (IC) manufacturing system 1000, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 1000.

In FIG. 10, IC manufacturing system 1000 includes entities, such as a design house 1020, a mask house 1030, and an IC manufacturer/fabricator (fab) 1050, that interact with one another in the design, development, and manufacturing cycles and/or services related to manufacturing an IC device 1060. The entities in system 1000 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1020, mask house 1030, and IC fab 1050 is owned by a single larger company. In some embodiments, two or more of design house 1020, mask house 1030, and IC fab 1050 coexist in a common facility and use common resources.

Design house (or design team) 1020 generates an IC design layout diagram 1022. IC design layout diagram 1022 includes various geometrical patterns designed for an IC device 1060. The geometrical patterns correspond to patterns of metal, oxide, or semiconductor layers that make up the various components of IC device 1060 to be fabricated. The various layers combine to form various IC features. For example, a portion of IC design layout diagram 1022 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1020 implements a proper design procedure to form IC design layout diagram 1022. The design procedure includes one or more of logic design, physical design or place and route. IC design layout diagram 1022 is presented in one or more data files having information of the geometrical patterns. For example, IC design layout diagram 1022 can be expressed in a GDSII file format or DFII file format.

Mask house 1030 includes data preparation 1032 and mask fabrication 1044. Mask house 1030 uses IC design layout diagram 1022 to manufacture one or more masks 1045 to be used for fabricating the various layers of IC device 1060 according to IC design layout diagram 1022. Mask house 1030 performs mask data preparation 1032, where IC design layout diagram 1022 is translated into a representative data file (RDF). Mask data preparation 1032 provides the RDF to mask fabrication 1044. Mask fabrication 1044 includes a mask writer. A mask writer converts the RDF to an image on a substrate, such as a mask (reticle) 1045 or a semiconductor wafer 1053. The design layout diagram 1022 is manipulated by mask data preparation 1032 to comply with particular characteristics of the mask writer and/or requirements of IC fab 1050. In FIG. 10, mask data preparation 1032 and mask fabrication 1044 are illustrated as separate elements. In some embodiments, mask data preparation 1032 and mask fabrication 1044 can be collectively referred to as mask data preparation.

In some embodiments, mask data preparation 1032 includes optical proximity correction (OPC) which uses lithography enhancement techniques to compensate for image errors, such as those that can arise from diffraction, interference, other process effects and the like. OPC adjusts IC design layout diagram 1022. In some embodiments, mask data preparation 1032 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1032 includes a mask rule checker (MRC) that checks the IC design layout diagram 1022 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1022 to compensate for photolithographic implementation effects during mask fabrication 1044, which may undo part of the modifications performed by OPC in order to meet mask creation rules.

In some embodiments, mask data preparation 1032 includes lithography process checking (LPC) that simulates processing that will be implemented by IC fab 1050 to fabricate IC device 1060. LPC simulates this processing based on IC design layout diagram 1022 to create a simulated manufactured device, such as IC device 1060. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus (DOF), mask error enhancement factor (MEEF), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1022.

It should be understood that the above description of mask data preparation 1032 has been simplified for the purposes of clarity. In some embodiments, data preparation 1032 includes additional features such as a logic operation (LOP) to modify the IC design layout diagram 1022 according to manufacturing rules. Additionally, the processes applied to IC design layout diagram 1022 during data preparation 1032 may be executed in a variety of different orders.

After mask data preparation 1032 and during mask fabrication 1044, a mask 1045 or a group of masks 1045 are fabricated based on the modified IC design layout diagram 1022. In some embodiments, mask fabrication 1044 includes performing one or more lithographic exposures based on IC design layout diagram 1022. In some embodiments, an electron-beam (e-beam) or a mechanism of multiple e-beams is used to form a pattern on a mask (photomask or reticle) 1045 based on the modified IC design layout diagram 1022. Mask 1045 can be formed in various technologies. In some embodiments, mask 1045 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1045 includes a transparent substrate (e.g., fused quartz) and an opaque material (e.g., chromium) coated in the opaque regions of the binary mask. In another example, mask 1045 is formed using a phase shift technology. In a phase shift mask (PSM) version of mask 1045, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1044 is used in a variety of processes. For example, such a mask(s) is used in an ion implantation process to form various doped regions in semiconductor wafer 1053, in an etching process to form various etching regions in semiconductor wafer 1053, and/or in other suitable processes.

IC fab 1050 is an IC fabrication business that includes one or more manufacturing facilities for the fabrication of a variety of different IC products. In some embodiments, IC Fab 1050 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1050 includes fabrication tools 1052 configured to execute various manufacturing operations on semiconductor wafer 1053 such that IC device 1060 is fabricated in accordance with the mask(s), e.g., mask 1045. In various embodiments, fabrication tools 1052 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1050 uses mask(s) 1045 fabricated by mask house 1030 to fabricate IC device 1060. Thus, IC fab 1050 at least indirectly uses IC design layout diagram 1022 to fabricate IC device 1060. In some embodiments, semiconductor wafer 1053 is fabricated by IC fab 1050 using mask(s) 1045 to form IC device 1060. In some embodiments, the IC fabrication includes performing one or more lithographic exposures based at least indirectly on IC design layout diagram 1022. Semiconductor wafer 1053 includes a silicon substrate or other proper substrate having material layers formed thereon. Semiconductor wafer 1053 further includes one or more of various doped regions, dielectric features, multilevel interconnects, and the like (formed at subsequent manufacturing steps).

An aspect of the present disclosure relates to an integrated circuit device. The integrated circuit device includes a first-type transistor and a second-type transistor stacked with each other at a front side of a substrate. The second-type transistor is between the first-type transistor and the substrate. The integrated circuit device also includes a front-side inductor having one or more conductors in a front-side upper metal layer above both the first-type transistor and the second-type transistor, and a back-side inductor having one or more conductors in a back-side lower metal layer at a back side of the substrate. The front-side inductor, the first-type transistor, and the second-type transistor form a stack directly above the back-side inductor. The integrated circuit device further includes a capacitive element coupled to a drain terminal of the first-type transistor and a drain terminal of the second-type transistor and forming an LC oscillator with the front-side inductor and the back-side inductor.

Another aspect of the present disclosure relates to an integrated circuit device. The integrated circuit device includes a first-type active-region semiconductor structure and a second-type active-region semiconductor structure stacked with each other at a front side of a substrate, a first-type transistor formed with the first-type active-region semiconductor structure, and a second-type transistor formed with the second-type active-region semiconductor structure. The integrated circuit device also includes a plurality of front-side middle conductive layers above both the first-type active-region semiconductor structure and the second-type active-region semiconductor structure at the front side of the substrate, a front-side upper metal layer above the plurality of front-side middle conductive layers, and a back-side lower metal layer at a back side of the substrate. The integrated circuit device further includes a front-side inductor having one or more conductors in the front-side upper metal layer, and a back-side inductor having one or more conductors in the back-side lower metal layer. The front-side inductor and the back-side inductor are conductively connected in series and forms a combined inductor which has a first terminal conductively connected to a drain terminal of the first-type transistor or a drain terminal of the second-type transistor.

Still another aspect of the present disclosure relates to a method. The method includes fabricating a first-type transistor on a front side of a substrate, and fabricating a second-type transistor atop the first-type transistor such that the first-type transistor and the second-type transistor are stacked with each other at the front side of the substrate. The method also includes fabricating a plurality of front-side middle conductive layers above both the first-type transistor and the second-type transistor at the front side of the substrate, fabricating a front-side upper metal layer above the plurality of front-side middle conductive layers, and forming a front-side inductor with one or more conductors in the front-side upper metal layer. The front-side inductor is conductively connected to a drain terminal of the first-type transistor or a drain terminal of the second-type transistor. The method further includes fabricating a back-side lower metal layer at a back side of the substrate, and forming a back-side inductor with one or more conductors in the back-side lower metal layer. The front-side inductor and the back-side inductor are conductively connected in series and forms a combined inductor which has a first terminal conductively connected to a drain terminal of the first-type transistor or a drain terminal of the second-type transistor.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. An integrated circuit device comprising:
a substrate;
a first-type transistor and a second-type transistor stacked with each other at a front side of the substrate, wherein the second-type transistor is between the first-type transistor and the substrate;
a front-side inductor having one or more conductors in a front-side upper metal layer above both the first-type transistor and the second-type transistor;
a back-side inductor having one or more conductors in a back-side lower metal layer at a back side of the substrate, wherein the front-side inductor, the first-type transistor, and the second-type transistor form a stack directly above the back-side inductor;
a capacitive element coupled to a drain terminal of the first-type transistor and a drain terminal of the second-type transistor and forming an LC oscillator with the front-side inductor and the back-side inductor; and
a first varactor and a second varactor connected in series between a first terminal of the capacitive element and a second terminal of the capacitive element.

2. The integrated circuit device of claim 1, wherein the front-side inductor and the back-side inductor are connected in series.

3. The integrated circuit device of claim 1, wherein the front-side inductor includes one or more conductor segments in another front-side metal layer which have a total length that is less than a total length of the one or more conductors in the front-side upper metal layer, wherein the one or more conductors in the front-side upper metal layer are conductively connected in series by the one or more conductor segments.

4. The integrated circuit device of claim 1, wherein the front-side inductor is a spiral coil in the front-side upper metal layer.

5. The integrated circuit device of claim 1, wherein the back-side inductor includes one or more conductor segments in another back-side metal layer which have a total length that is less than a total length of the one or more conductors in the back-side lower metal layer, wherein the one or more conductors in the back-side lower metal layer are conductively connected in series by the one or more conductor segments.

6. The integrated circuit device of claim 1, wherein the back-side inductor is a spiral coil in the back-side lower metal layer.

7. The integrated circuit device of claim 1, wherein the capacitive element is in one or more front-side middle conductive layers between the substrate and the front-side upper metal layer.

8. The integrated circuit device of claim 1, wherein the capacitive element is in one or more back-side middle conductive layers between the substrate and the back-side lower metal layer.

9. An integrated circuit device comprising:
a substrate;
a first-type active-region semiconductor structure and a second-type active-region semiconductor structure stacked with each other at a front side of the substrate;
a first-type transistor formed with the first-type active-region semiconductor structure;
a second-type transistor formed with the second-type active-region semiconductor structure;
a plurality of front-side middle conductive layers above both the first-type active-region semiconductor structure and the second-type active-region semiconductor structure at the front side of the substrate;
a front-side upper metal layer above the plurality of front-side middle conductive layers;
a front-side inductor having one or more conductors in the front-side upper metal layer;
a back-side lower metal layer at a back side of the substrate; and
a back-side inductor having one or more conductors in the back-side lower metal layer, wherein the front-side inductor and the back-side inductor are conductively connected in series and forms a combined inductor which has a first terminal conductively connected to a drain terminal of the first-type transistor or a drain terminal of the second-type transistor; and a first varactor connected between the first terminal of the combined inductor and a tuning node; and a second varactor connected between a second terminal of the combined inductor and the tuning node, wherein the tuning node is configured to receive a tuning voltage.

10. The integrated circuit device of claim 9, wherein the first terminal of the combined inductor is conductively connected to both the drain terminal of the first-type transistor and the drain terminal of the second-type transistor.

11. The integrated circuit device of claim 9, further comprising:

a capacitive element formed in the plurality of front-side middle conductive layers, wherein the capacitive element is conductively connected to the drain terminal of the first-type transistor or the drain terminal of the second-type transistor.

12. The integrated circuit device of claim 9, further comprising:

a plurality of back-side middle conductive layers at the back side of the substrate between the substrate and the back-side lower metal layer; and a capacitive element formed in the plurality of back-side middle conductive layers, wherein the capacitive element is conductively connected to the drain terminal of the first-type transistor or the drain terminal of the second-type transistor.

13. The integrated circuit device of claim 9, wherein the first-type transistor is a PMOS transistor, and the second-type transistor is an NMOS transistor.

14. The integrated circuit device of claim 9, wherein the first-type transistor is an NMOS transistor, and the second-type transistor is a PMOS transistor.

15. The integrated circuit device of claim 9, further comprising:

a first gate-conductor intersecting the first-type active-region semiconductor structure at a channel region of the first-type transistor or the second-type active-region semiconductor structure at a channel region of the second-type transistor;

a first terminal-conductor intersecting the first-type active-region semiconductor structure at a drain region of the first-type transistor or intersecting the second-type active-region semiconductor structure at a drain region of the second-type transistor;

a second gate-conductor intersecting the first-type active-region semiconductor structure or the second-type active-region semiconductor structure, wherein the first terminal-conductor is between the first gate-conductor and the second gate-conductor;

a conductor conductively connecting the second gate-conductor with the first terminal-conductor; and a second terminal-conductor intersecting the first-type active-region semiconductor structure or the second-type active-region semiconductor structure, wherein the second gate-conductor is between the first terminal-conductor and the second terminal-conductor.

16. An integrated circuit device comprising:

a substrate;

a first first-type active-region semiconductor structure and a first second-type active-region semiconductor structure stacked with each other at a front side of the substrate;

a second first-type active-region semiconductor structure and a second second-type active-region semiconductor structure stacked with each other at the front side of the substrate;

a first first-type transistor formed with the first first-type active-region semiconductor structure;

a second first-type transistor formed with the second first-type active-region semiconductor structure;

a first second-type transistor formed with the first second-type active-region semiconductor structure;

a second second-type transistor formed with the second second-type active-region semiconductor structure;

a front-side inductor dominantly formed with conductors in a front-side upper metal layer, wherein the front-side inductor is directly above the first first-type transistor and the first second-type transistor;

a back-side inductor dominantly formed with conductors in a back-side lower metal layer at a back side of the substrate, wherein the back-side inductor is directly below the first first-type transistor and the first second-type transistor; and a combined inductor formed with the front-side inductor and the back-side inductor conductively connected in series, wherein a first terminal of the combined inductor is conductively connected to a drain terminal of the first first-type transistor and a drain terminal of the first second-type transistor, and wherein a second terminal of the combined inductor is conductively connected to a drain terminal of the second first-type transistor and a drain terminal of the second second-type transistor; and a first varactor and a second varactor connected in series between the first terminal of the combined inductor and the second terminal of the combined inductor.

17. The integrated circuit device of claim 16, further comprising:

a first gate-conductor intersecting the first first-type active-region semiconductor structure and the second first-type active-region semiconductor structure; and a second gate-conductor intersecting the first first-type active-region semiconductor structure and the second first-type active-region semiconductor structure.

18. The integrated circuit device of claim 17, wherein:

a third gate-conductor intersecting the first second-type active-region semiconductor structure and the second second-type active-region semiconductor structure; and a fourth gate-conductor intersecting the first second-type active-region semiconductor structure and the second second-type active-region semiconductor structure.

19. The integrated circuit device of claim 17, further comprising:

a first terminal-conductor intersecting the first first-type active-region semiconductor structure at a drain region of the first first-type transistor;

a first conductor conductively connecting the second gate-conductor with the first terminal-conductor; and a second terminal-conductor intersecting the first first-type active-region semiconductor structure, wherein the second gate-conductor is between the first terminal-conductor and the second terminal-conductor.

20. The integrated circuit device of claim 17, further comprising:

a third terminal-conductor intersecting the second first-type active-region semiconductor structure at a drain region of the second first-type transistor;

a second conductor conductively connecting the first gate-conductor with the third terminal-conductor; and a fourth terminal-conductor intersecting the second first-type active-region semiconductor structure, wherein the first gate-conductor is between the third terminal-conductor and the fourth terminal-conductor.

* * * * *